(12) United States Patent
Baars et al.

(10) Patent No.: US 11,916,109 B2
(45) Date of Patent: Feb. 27, 2024

(54) BIPOLAR TRANSISTOR STRUCTURES WITH BASE HAVING VARYING HORIZONTAL WIDTH AND METHODS TO FORM SAME

(71) Applicant: GlobalFoundries U.S. Inc., Malta, NY (US)

(72) Inventors: Peter Baars, Dresden (DE); Alexander M. Derrickson, Saratoga Springs, NY (US); Ketankumar Harishbhai Tailor, Dresden (DE); Zhixing Zhao, Dresden (DE); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/804,201

(22) Filed: May 26, 2022

(65) Prior Publication Data
US 2023/0290829 A1    Sep. 14, 2023

Related U.S. Application Data

(60) Provisional application No. 63/268,981, filed on Mar. 8, 2022.

(51) Int. Cl.
*H01L 29/10*   (2006.01)
*H01L 29/66*   (2006.01)
*H01L 29/735*  (2006.01)

(52) U.S. Cl.
CPC .... *H01L 29/1004* (2013.01); *H01L 29/66234* (2013.01); *H01L 29/735* (2013.01)

(58) Field of Classification Search
CPC ........... H01L 29/1008; H01L 29/66242; H01L 29/6625; H01L 29/735; H01L 29/737
See application file for complete search history.

(56) References Cited

U.S. PATENT DOCUMENTS 7,285,454 B1   10/2007  Liang et al.
8,288,758 B2   10/2012  Ning et al.
(Continued)

FOREIGN PATENT DOCUMENTS

CN   106206697 B   12/2015
EP   4184588 A1    5/2023
GB   2538348 B    11/2016

OTHER PUBLICATIONS

European Search Report dated Jul. 18, 2023 for EP 22205703.6; pp. 11.
U.S. Appl. No. 17/524,043, Notice of Allowance dated Apr. 5, 2023, 12 pages.
U.S. Appl. No. 17/524,043, Office Action dated Mar. 16, 2023, 13 pages.
(Continued)

*Primary Examiner* — Syed I Gheyas
(74) *Attorney, Agent, or Firm* — Francois Pagette; Hoffman Warnick LLC

(57) ABSTRACT

Embodiments of the disclosure provide a bipolar transistor structure having a base with a varying horizontal width and methods to form the same. The bipolar transistor structure includes a first emitter/collector (E/C) layer on an insulator layer. A base layer is over the insulator layer. A spacer between the first E/C layer and the base layer. The base layer includes a lower base region, and the spacer is adjacent to the lower base region and the first E/C layer. An upper base region is on the lower base region and the spacer. A horizontal width of the upper base region is larger than a horizontal width of the lower base region.

20 Claims, 10 Drawing Sheets

(56) References Cited

U.S. PATENT DOCUMENTS

| | | |
|---|---|---|
| 8,558,282 B1 | 10/2013 | Cai et al. |
| 8,586,441 B1 | 11/2013 | Cai et al. |
| 8,846,481 B2 | 9/2014 | Cantell et al. |
| 9,059,016 B1 * | 6/2015 | Hekmatshoar-Tabari ................... H01L 29/6625 |
| 9,224,837 B2 | 12/2015 | Anderson et al. |
| 9,324,705 B2 | 4/2016 | Ko et al. |
| 9,461,139 B1 | 10/2016 | Liu |
| 9,691,866 B2 | 6/2017 | Regnier et al. |
| 10,454,591 B2 | 10/2019 | Voingescu et al. |
| 10,707,336 B1 | 7/2020 | Hashemi et al. |
| 10,825,921 B2 | 11/2020 | Balakrishnan et al. |
| 11,710,771 B2 | 7/2023 | Derrickson et al. |
| 2013/0256757 A1 | 10/2013 | Cai et al. |
| 2016/0087068 A1 | 3/2016 | Cai et al. |
| 2016/0300934 A1 * | 10/2016 | Cai ........................ H01L 29/16 |
| 2020/0066876 A1 | 2/2020 | Hashemi et al. |
| 2023/0083044 A1 | 3/2023 | Derrickson et al. |
| 2023/0290829 A1 | 9/2023 | Baars et al. |

OTHER PUBLICATIONS

U.S. Appl. No. 17/804,201, Notice of Allowance dated Oct. 2, 2023, 12 pages.

U.S. Appl. No. 17/804,201, Office Action dated Jun. 22, 2023, 22 pages.

U.S. Appl. No. 17/804,201, Response to Office Action filed Sep. 22, 2023, 11 pages.

European Search Report for corresponding EP Application No. 22205703.6 dated Jul. 18, 2023, 11 pages.

U.S. Appl. No. 63/238,406, Application entitled Bipolar Transistor Structure With Inner Spacer Alongside Extrinsic Base and Methods to Form Same, filed Aug. 30, 2021, 16 pages.

Hashemi et al., "Demonstration of Symmetric Lateral NPN Transistors on SOI Featuring Epitaxially Grown Emitter/Collector Regions," Journal of the Electron Devices Society, vol. 6, May 7, 2018, pp. 537-542.

U.S. Appl. No. 63/238,406 entitled: "Bipolar Transistor Structure with Inner Spacer alongside Extrinsic Base and methods to form same," filed Aug. 30, 2021, 16 pages.

\* cited by examiner

BIPOLAR TRANSISTOR STRUCTURES WITH BASE HAVING VARYING HORIZONTAL WIDTH AND METHODS TO FORM SAME

BACKGROUND

1. Technical Field

The present disclosure provides a bipolar structure transistor with a base having a varying horizontal width and methods to form the same.

2. Background Art

Present technology is at atomic level scaling of certain micro-devices such as logic gates, bipolar transistors, field effect transistors (FETs), and capacitors. Circuit chips with millions of such devices are common. The structure of a lateral bipolar transistor defines several of its properties during operation. Conventional integrated circuits may employ vertical bipolar transistors or silicon germanium (SiGe) bipolar transistors, but these types of devices may have higher costs and/or operational parameters that do not meet certain constraints.

SUMMARY

The illustrative aspects of the present disclosure are designed to solve the problems herein described and/or other problems not discussed.

Embodiments of the disclosure provide a bipolar transistor structure including: a first emitter/collector (E/C) layer on an insulator layer; a base layer over the insulator layer; and a spacer between the first E/C layer and the base layer, wherein the base layer includes: a lower base region, wherein the spacer is adjacent to the lower base region and the first E/C layer, and an upper base region on the lower base region and the spacer, wherein a horizontal width of the upper base region is larger than a horizontal width of the lower base region.

Other embodiments of the disclosure provide a bipolar transistor structure including: a first emitter/collector (E/C) layer on a first portion of an insulator layer; a spacer on the first E/C layer; and a base layer over a second portion of the insulator layer, the base layer including: a lower base region on the insulator layer, wherein the first E/C layer and the spacer are adjacent the lower base region, and an upper base region on the lower base region and the spacer, wherein a horizontal width of the upper base region is larger than a combined horizontal width of the lower base region and the spacer, and the upper base region overhangs an outers sidewall of the spacer.

Additional embodiments of the disclosure provide a method of forming a bipolar transistor structure, the method including: forming a first emitter/collector (E/C) layer on an insulator layer; forming a base layer over the insulator layer; and forming a spacer between the first E/C layer and the base layer, wherein the base layer includes: a lower base region, wherein the spacer is adjacent to the lower base region and the first E/C layer, and an upper base region on the lower base region and the spacer, wherein a horizontal width of the upper base region is larger than a horizontal width of the lower base region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
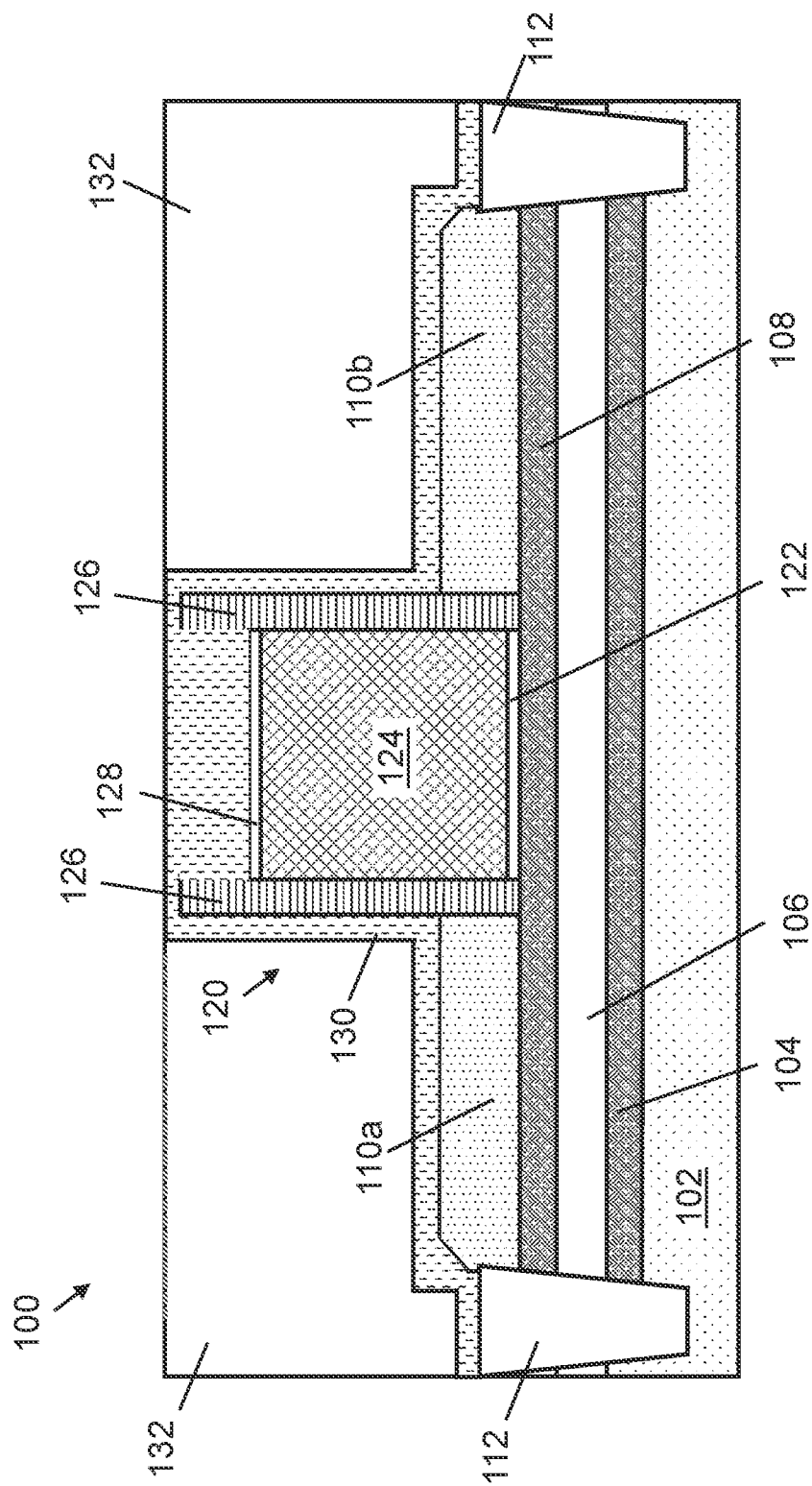
FIG. 1 shows a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a bipolar transistor structure having a base with a varying horizontal width and methods to form the same. The lateral bipolar transistor structure may include an emitter/collector (E/C) layer of semiconductor material that is over an insulator. The E/C layer may have a first doping type, e.g., P type or N type. A spacer is on the E/C layer. A base layer, with an opposite doping type from the E/C layer, is on the insulator and adjacent the E/C layer. The base layer includes a lower base region, such that the spacer is adjacent the lower base region and the first E/C layer. An upper base region is on the lower base region and the spacer, and the upper base region has a horizontal width that is larger than a horizontal width of the lower base region. The upper base region may overlie the spacer, and in some cases, may extend beyond the spacer to overhang an outer sidewall of the spacer.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Referring to FIG. 1, a preliminary structure 100 (simply "structure" hereafter) suitable to form a lateral bipolar transistor structure according to embodiments of the disclosure, is shown. Preliminary structure 100 may be processed as described herein to yield one or more lateral bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. A doped well region 104 may be included on or within substrate 102, e.g., to enable electrical biasing of structures or components formed above substrate 102. Doped well region 104 may any conceivable doping type and/or doping composition. For instance, doped well region 104 may have the same dopant type as substrate 102 (e.g., P type doping), a different doping type, similar or different doping species, and/or may have a higher or lower higher dopant concentration therein.

Structure 100 may include embedded elements for electrically separating active materials formed over substrate 102 from other regions and/or materials. An insulator layer 106 optionally may be formed over doped well region 104 and substrate 102, e.g., by forming a layer of dielectric material (e.g., oxide or nitride insulative material), converting silicon material within substrate 102 or doped well region 104 into a higher-resistive material such as polycrystalline or amorphous silicon (poly-Si), or other techniques.

A semiconductor on insulator (SOI) layer may be on insulator layer 106 and may include any currently known or later developed semiconductor material (e.g., any of those described herein regarding substrate 102 and/or doped well region 104). An emitter/collector (E/C) layer 108 may be formed by deposition and/or epitaxial growth of silicon and/or other semiconductor materials on insulator layer 106 and may have a predetermined doping type, e.g., by being doped in-situ or during formation of semiconductor material on insulator layer 106. A set of overlying E/C layers 110 may be formed on respective portions of E/C layer 108. Overlying E/C layers 110 may be identified separately as a first overlying E/C layer 110a over one portion of E/C layer 108, and a second overlying E/C layer 110b over another portion of E/C layer 108. The doping type of overlying E/C layers 110a, 110b may be the same as the doping type of E/C layer 108 thereunder, but overlying E/C layers 110a, 110b may include a different composition (e.g., silicon germanium (SiGe)) relative to E/C layer 108. According to an example, E/C layer 108 may be undoped or only lightly doped, while overlying E/C layers 110a, 110b may be more highly doped N type to provide active semiconductor material for use in the emitter and collector terminals terminal of an eventual lateral bipolar transistor structure.

Insulator layer 106 may extend horizontally throughout structure 100, and/or may be formed selectively under locations where active materials are formed, examples of which are discussed elsewhere herein. In further implementations, insulator layer 106 may include oxygen doping to form a dielectric insulator or a buried oxide ("BOX") layer over substrate 102 to electrically isolate E/C layer 108 from substrate 102. Insulator layer 106 thus may include other elements or molecules such as Ge, N, or Si. However embodied, insulator layer 106 may be sized as narrow as possible to provide better interaction with overlying semiconductor materials (e.g., E/C layer 108, overlying E/C layers 110a, 110b and components formed thereon or therefrom). In various embodiments, insulator layer 106 may have a thickness that is at most approximately twenty nanometers (nm) to approximately five-hundred nm. Some portions (not shown) of substrate 102 may not have insulator layer 106 thereover, and/or multiple layers of insulator layer 106 may be formed on substrate 102 to varying thicknesses. Additionally, various conductive particles ("dopants") may be introduced into substrate 102 via a process known as "pre-doping" of substrate 102.

Structure 100 (FIG. 1) may include a set of trench isolations (TI(s)) 112. TI(s) 112 may be made by forming and filling trenches (not labeled) with an insulating material such as oxide. TI(s) 112 horizontally isolate insulator layer 106, E/C layer 108, and overlying E/C layers 110a, 110b from any adjacent regions of material. Various portions of a bipolar transistor structure, including the active semiconductor materials thereof and/or other devices where applicable, may be formed on or above portions of insulator layer 106 that are isolated by TI(s) 112. According to one example, two TIs 112 are formed, with insulator layer 106, E/C layer 108, and overlying E/C layers 110a, 110b being horizontally between the two TIs 112. TI(s) 112 may be formed before active materials are formed over substrate 102, but this is not necessarily true in all implementations.

Each TI 112 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. In some cases, E/C layers 110a, 110b may extend to a height above the horizontally adjacent TI(s) 112, e.g., due to being formed by epitaxial growth of semiconductor material(s). In other cases, TI(s) 112 and overlying E/C layers 110a, 110b may be planarized (e.g., by chemical mechanical planarization or other technique(s)) such that the upper surface(s) thereof is/are substantially coplanar with each other.

Structure 100 may include a base assembly 120 on E/C layer 108, e.g., to allow subsequent or independent processing of E/C layer 108 according to embodiments of the disclosure. The forming of base assembly 120 may include forming an insulative liner 122 on a portion of E/C layer 108, and forming a polycrystalline semiconductor 124 (e.g., poly-Si) on insulative liner 122. Polycrystalline semiconductor 124 may not form part of the eventual bipolar transistor structure and may be formed as a placeholder material within base assembly 120 for later removal and replacement with other active and/or insulative materials. In addition, embodiments of the disclosure may include forming a set of outer spacers 126 on outer surfaces of insulative liner 122 and/or polycrystalline semiconductor 124. Outer spacers 126 are identified as such due to the removal of polycrystalline semiconductor 124 and forming of additional spacer material on horizontally interior surfaces of outer spacers 126 in subsequent processing. Outer spacers 126 can be provided as one or more bodies of insulating material formed on the upper surface of a material, e.g., by deposition, thermal growth, etc., to electrically and physically insulate materials subsequently formed on the coated material(s) from other components. According to an example, outer spacer 126 may have one or more oxide insulator materials (e.g., $SiO_2$) formed to a desired thickness. In this case, outer spacer 126 alternatively may be formed, e.g., by oxidizing exposed outer surfaces of polycrystalline semiconductor 124 to convert its material composition into an oxide insulator (e.g., converting from poly-Si to silicon dioxide ($SiO_2$) or other semiconductor oxides).

Base assembly 120 may include an insulative cap 128 (e.g., a layer of oxide and/or other insulators to the same thickness as insulative liner 122) on polycrystalline semiconductor 124. Structure 100 additionally may include a barrier liner 130 (including, e.g., nitride and/or films of other insulating material(s)) on exposed surfaces of overlying E/C layer(s) 110a, 110b, TI(s) 112, outer spacers 126, and barrier liner 130, e.g., by deposition. As discussed herein, barrier liner 130 may be formed to any desired thickness over overlying E/C layers 110a, 110b and base assembly 120 to produce varying effects on bipolar transistor performance.

Structure 100 also may include an insulator layer 132 over overlying E/C layers 110a, 110b, TI(s) 112, base assembly 120, etc., formed by deposition or other techniques of forming an insulative material on a structure. Additional metallization layers (not shown) may be formed on insulator layer 132 in subsequent processing during middle-of-line and/or back-end-of-line processing. Insulator layer 132 may include any currently known or later developed insulative layer, e.g., those included within insulator layer 106 and/or TI(s) 112. Despite insulator layer 132 possibly having a similar or identical composition to such materials, it is formed separately from other insulative material and physical boundaries and/or interfaces between insulator layer 132 and other such materials may be present in the structure.

Figure 2:
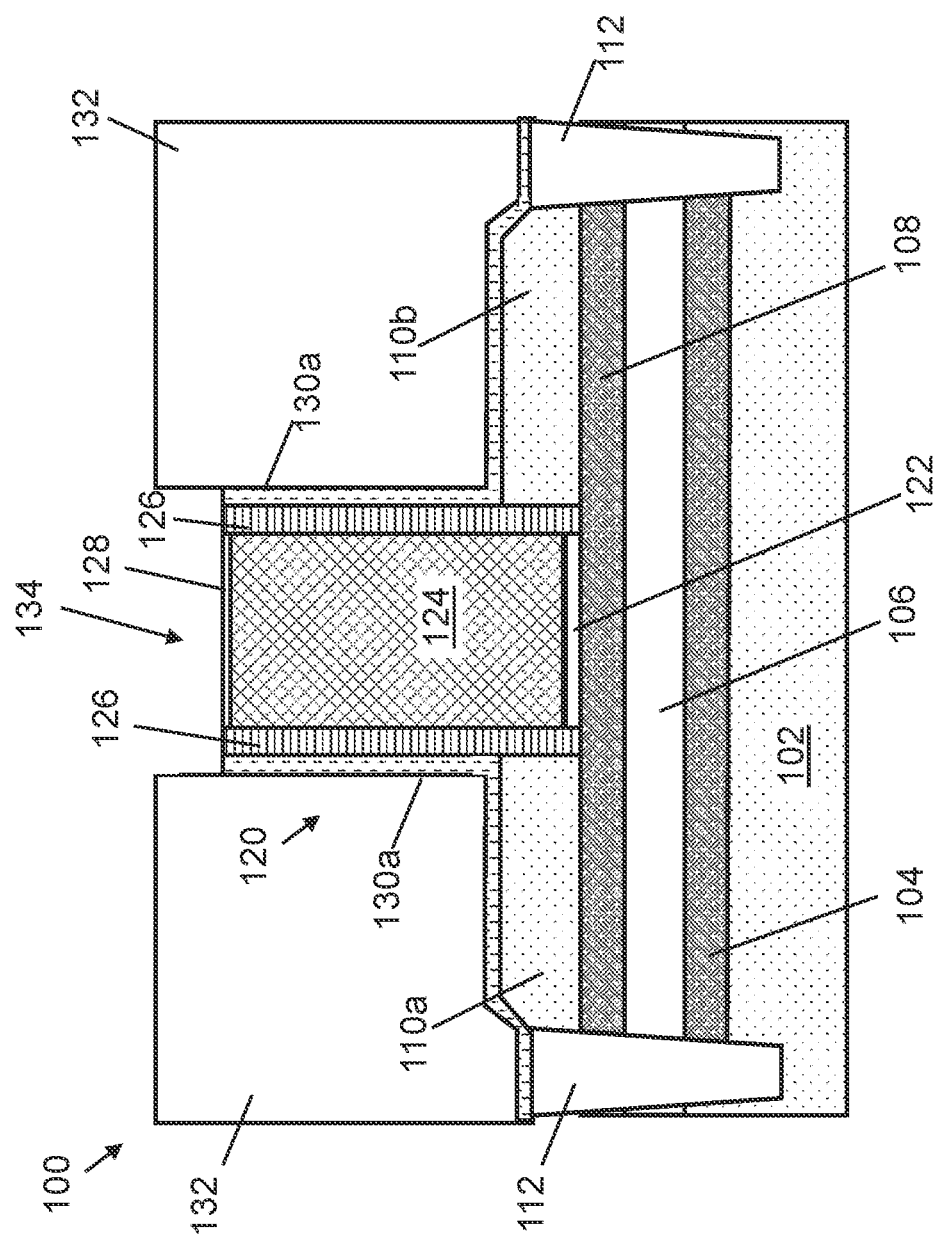
FIG. 2 shows a cross-sectional view of forming an opening over an initial base structure according to embodiments of the disclosure.
Figure 3:
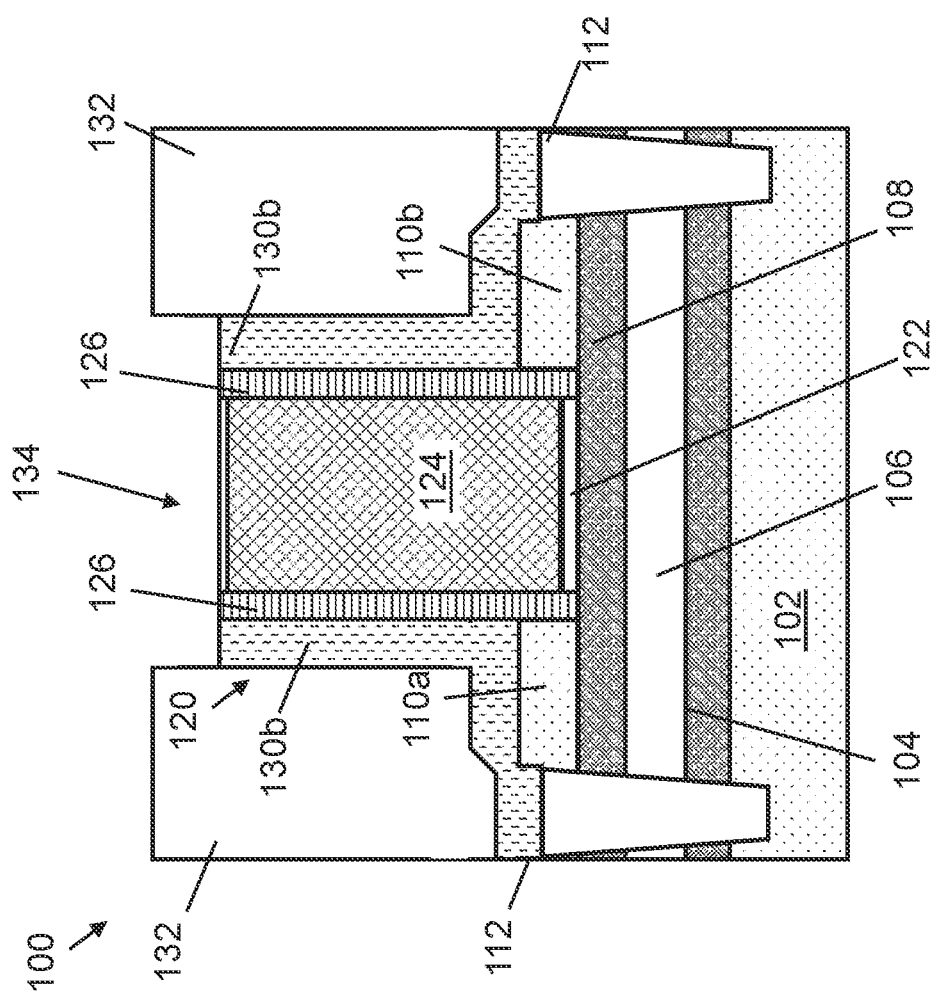
FIG. 3 shows a cross-sectional view of forming an opening over an initial base structure with a thicker nitride layer according to embodiments of the disclosure.

FIGS. 2 and 3 depict further stages of processing and varying sizes of barrier liner 130. FIG. 2 depicts structure 100 with a relatively thin (e.g., approximately five nanometer (nm) thickness) barrier liner 130a, whereas FIG. 3 depicts structure 100 with a relatively thick (e.g., approximately ten nm thickness) barrier liner 130b. In all other respects structure 100 may include similar or identical features in FIGS. 2 and 3. To prepare structure 100 for subsequent removing and replacing of polycrystalline semiconductor 124, embodiments of the disclosure may include partially removing (e.g., by directional etching such as reactive ion etching (RIE)) outer spacers 126 and barrier liner 130 to form an opening 134 in insulator layer 132 over base assembly 120. Insulative cap 128 of base assembly 120 may be exposed at the lowermost surface of opening 134, e.g., to allow removal and replacement of polycrystalline semiconductor 124 and insulative cap 128 in subsequent processing.

By varying the thickness of barrier liner 130 (e.g., as indicated by the relative thicknesses of liners 130a (FIG. 2), 130b (FIG. 3)), the horizontal thickness of opening 134 can also be controlled. A wider opening 134 allows base material to be formed with a wider horizontal width in subsequent processing, whereas a narrower opening 134 may produce a smaller horizontal width in subsequent processing. Hence, barrier liner 130 can affect the position of bipolar transistor structures on substrate 102 relative to each other, as well as the size and shape of various elements within the eventual bipolar transistor structure (e.g., horizontal thickness of base). Although barrier liner 130 is shown with only one thickness in subsequent FIGS., it is understood that the various processing stages discussed herein may be implemented without regard to barrier liner 130 thickness (i.e., they may be implemented on structure 100 as illustrated in FIG. 2 or 3 without changes).

Figure 4:
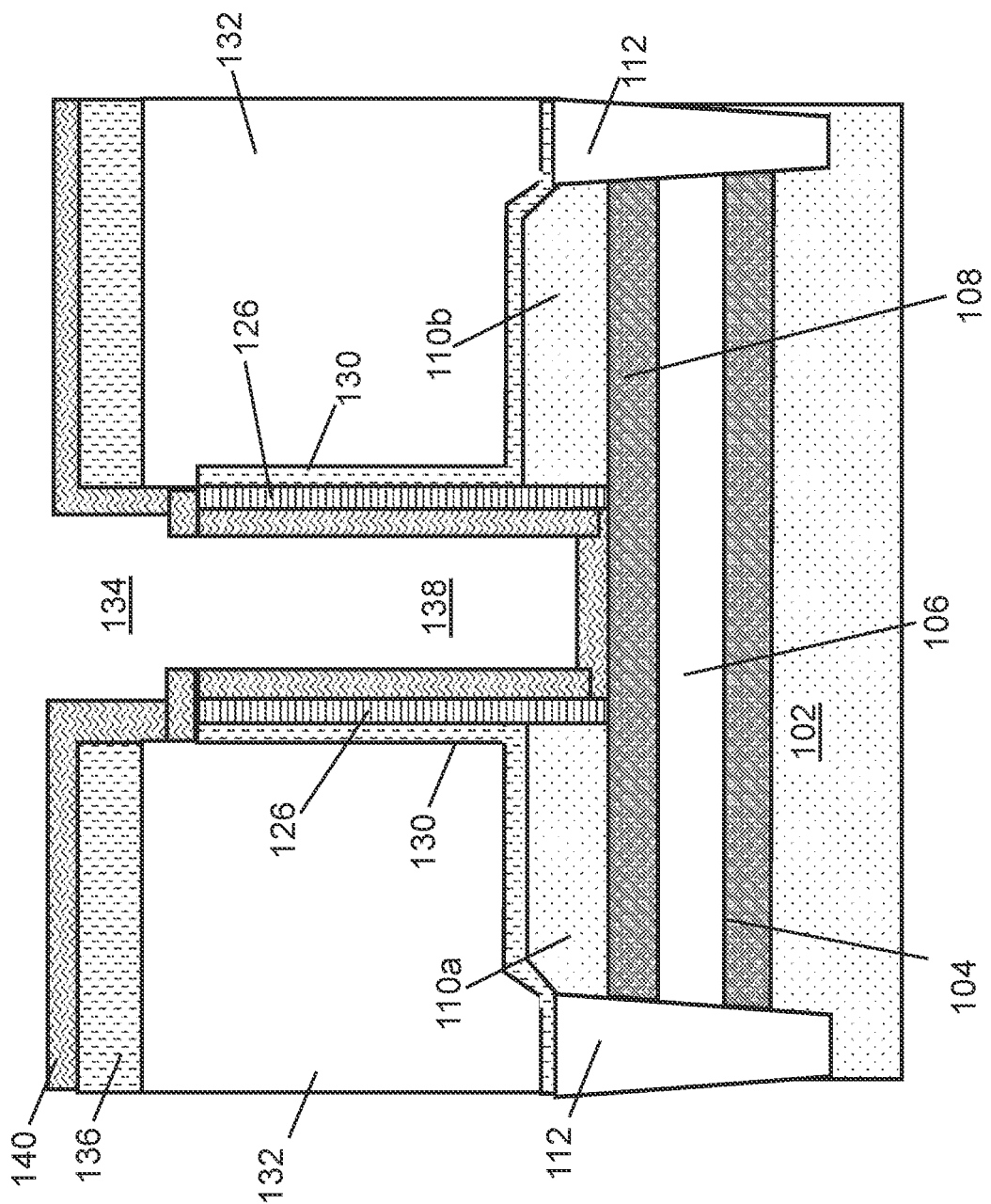
FIG. 4 shows a cross-sectional view of removing the initial base structure to define an opening of varying width according to embodiments of the disclosure.

Turning to FIG. 4, further processing may include forming a first spacer layer 136 over insulator layer 132 to a desired thickness, e.g., by deposition of nitride and/or other spacer materials. First spacer layer 136 thereafter can be removed from within opening 134, e.g., by directional etching and/or other procedures to remove spacer material from targeted locations. The removing of first spacer layer 136 from opening 134 may also include removing polycrystalline semiconductor 124 (FIGS. 1-3) from the structure to form a base opening 138 below opening 134. Outer spacer(s) 126 may define the width of base opening 138, and hence it may be continuous with opening 134 but of smaller horizontal thickness than opening 134 thereover.

Embodiments of the disclosure may include, as also shown in FIG. 4, forming a second spacer layer 140 within opening 134 on first spacer layer 136, and within base opening 138 on E/C layer 108 and exposed portions of outer spacer 126. Second spacer layer 140 may be formed to approximately the same thickness as outer spacer 126, or any other desired thickness. However, second spacer layer 140 may include a layer of insulating material that is different from outer spacer 126. For instance, second spacer layer 140 may include one or more nitride insulators (e.g., SiN) in the case where outer spacer 126 includes an oxide insulator. The two spacer layers may cooperate to constrain the horizontal width of any subsequent semiconductor base materials formed in place of polycrystalline semiconductor 124 in subsequent processing. As discussed elsewhere herein, second spacer layer 140 may be processed into an inner spacer for additional physical and electrical separation of emitter, base, and collector terminals of a lateral bipolar transistor.

Figure 5:
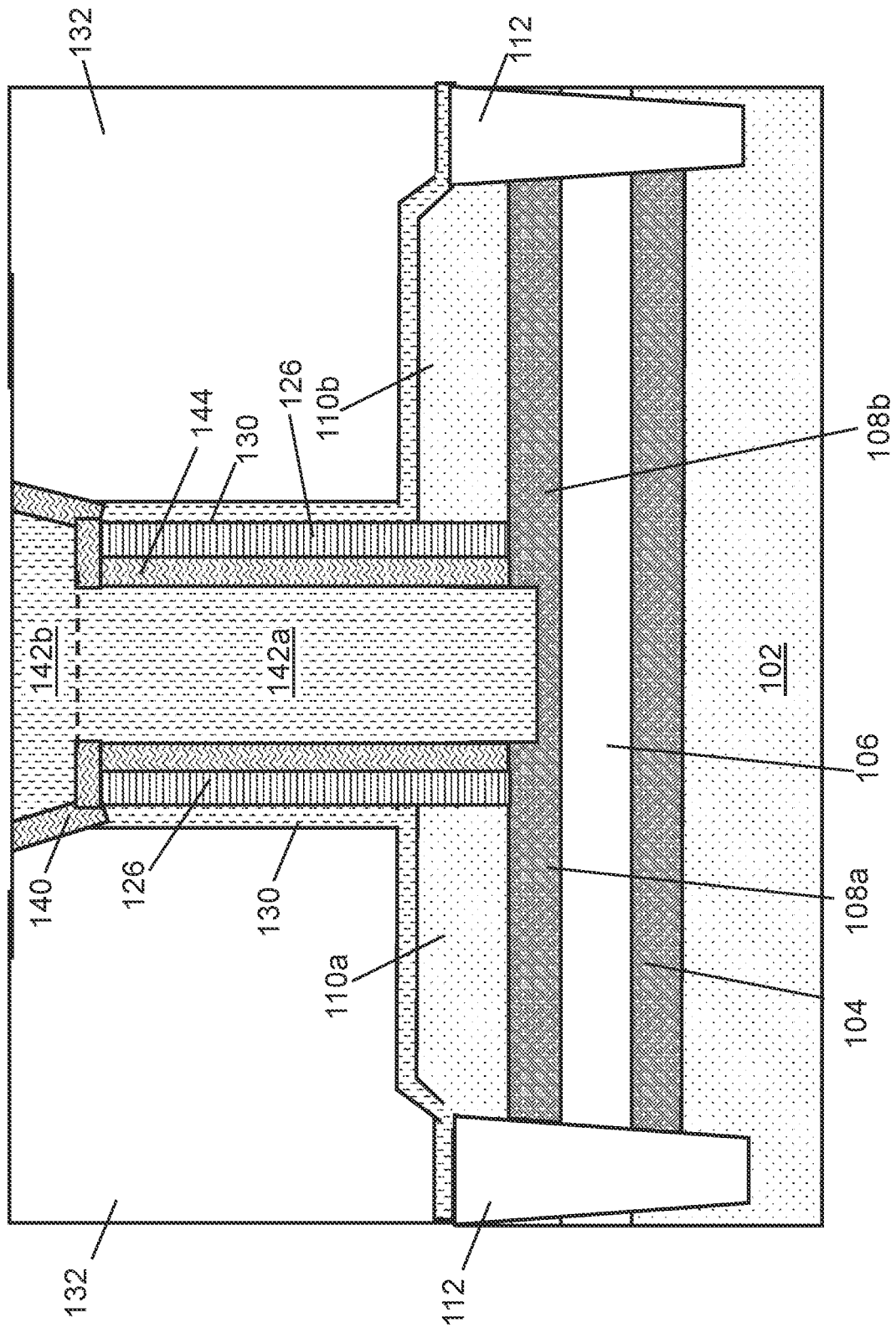
FIG. 5 shows a cross-sectional view of forming a base material within the opening according to embodiments of the disclosure.

FIG. 5 depicts forming a base layer 142 within openings 134 (FIGS. 2-4), 138 (FIG. 4) to form the third terminal of an eventual bipolar transistor structure. Base layer 142 may be formed by deposition and/or epitaxial growth of silicon germanium (SiGe) and/or other semiconductor materials within openings 134, 138. Base layer 142 optionally may have the same or different doping type as a portion of E/C layer 108 thereunder (e.g., both may be doped P type, and/or they may be alternately doped P type and N type). Base layer 142 can be formed for example by removing horizontally-extending portions of second spacer layer 140, and optionally, underlying portions of E/C layer 108 and forming base layer 142 thereover. The partial removing of second spacer layer 140 may define a set of inner spacers 144 on sidewalls of outer spacers 126. Base layer 142 may have a higher concentration of dopants than E/C layer 108. The forming of base layer 142 may subdivide E/C layer 108 into distinct regions, e.g., a first E/C layer 108a that is adjacent one horizontal end of base layer 142, and a second E/C layer 108b that is horizontally adjacent the opposite horizontal end of base layer 142. In the eventual bipolar transistor structure, first E/C layer 108a may define an emitter while second E/C layer 108b defines a collector or vice versa.

Base layer 142, in addition, may include two or more distinct regions. A lower base region 142a of base layer 142 may occupy the space previously designated as base opening 138 and may have a horizontal width defined by spacers 126, 144. Lower base region 142a optionally may have sidewalls that are substantially perpendicular to the upper surface of E/C layer 108 (i.e., the sidewalls or width of lower base region 142a does not taper with respect to distance above E/C layer 108). An upper base region 142b may occupy the space previously designated as opening 134 and may have a horizontal width that is larger than lower base region 142a. As noted elsewhere herein, the thickness of barrier liner 130 (FIGS. 1-3) and second spacer layer 140 may control the width of opening 134 and hence the horizontal width of upper base region 142b. Thus, the previous forming of openings 134, 138 can allow a base layer 142 to have distinct horizontal widths within its lower base region 142a and upper base region 142b. Further processing may include forming additional doped regions and/or electrical couplings to define the various terminals of a bipolar transistor structure.

Figure 6:
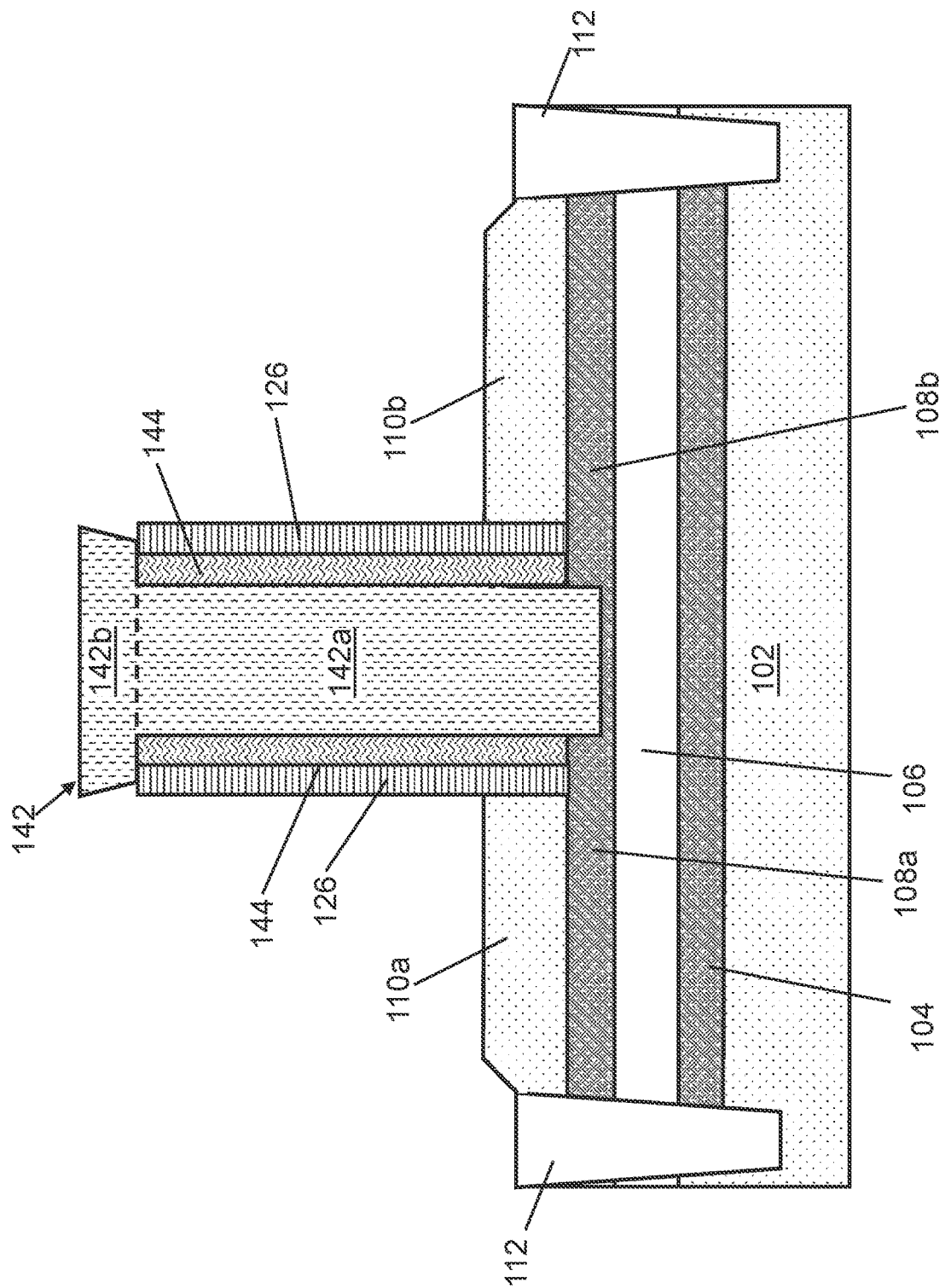
FIG. 6 shows a cross-sectional view of removing an initial insulator to expose emitter/collector materials according to embodiments of the disclosure.

FIG. 6 depicts removing insulator layer 132, as well as remaining portions of barrier liner 130, and any portions of inner spacer(s) 144 not covered by outer spacer(s) 126 (e.g., those adjacent upper base region 142b. The removing of insulator layer 132 may include, e.g., selective etching of insulator layer 132 and barrier liner 130 by use of selective etchants (e.g., liquid based etchants). Similar materials may be used to remove inner spacer(s) 144 without affecting any portions covered by upper base region 142b and/or outer spacer(s) 126.

Figure 7:
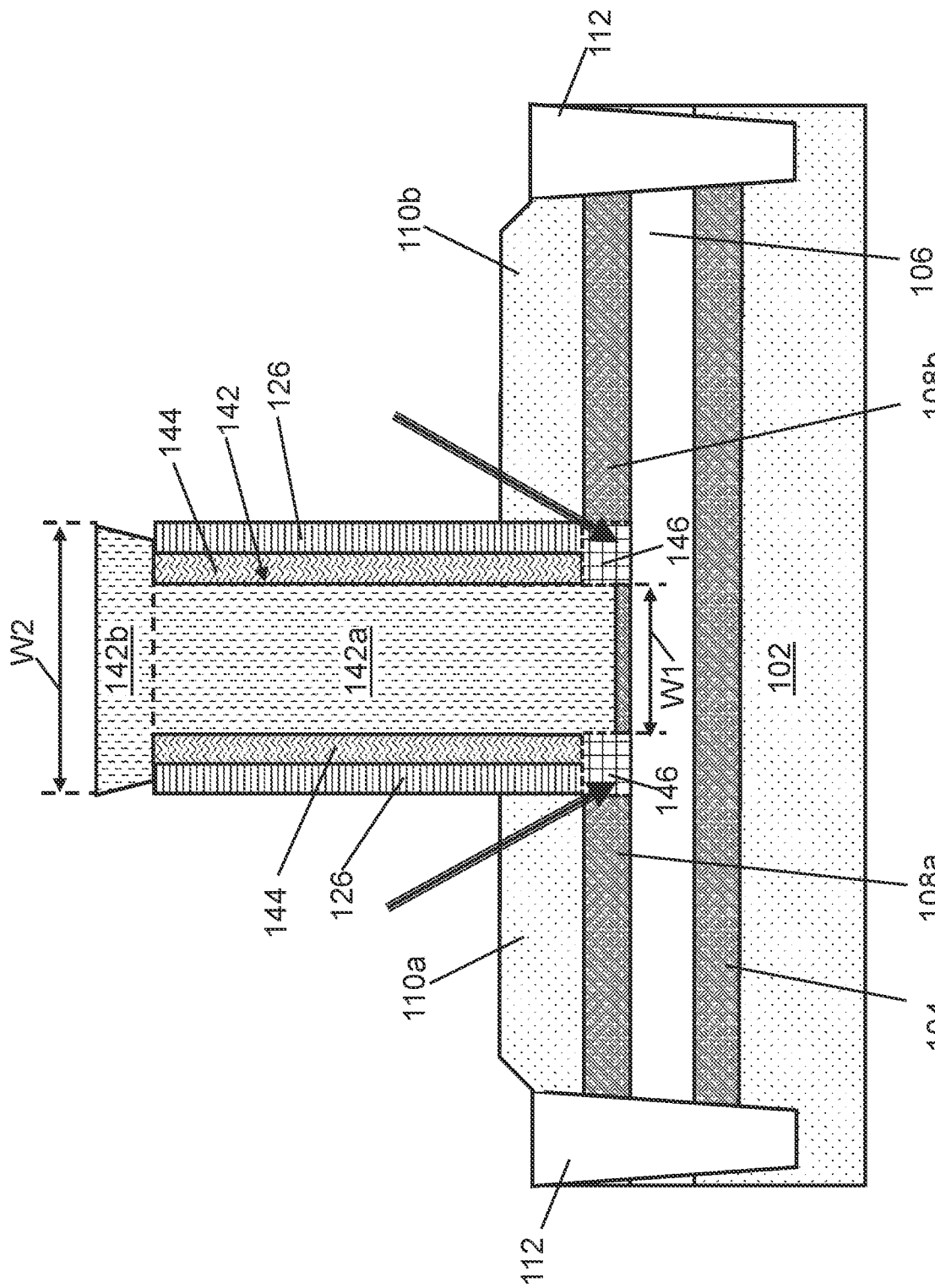
FIG. 7 shows a cross-sectional view of doping E/C materials below a base material according to embodiments of the disclosure.
Figure 8:
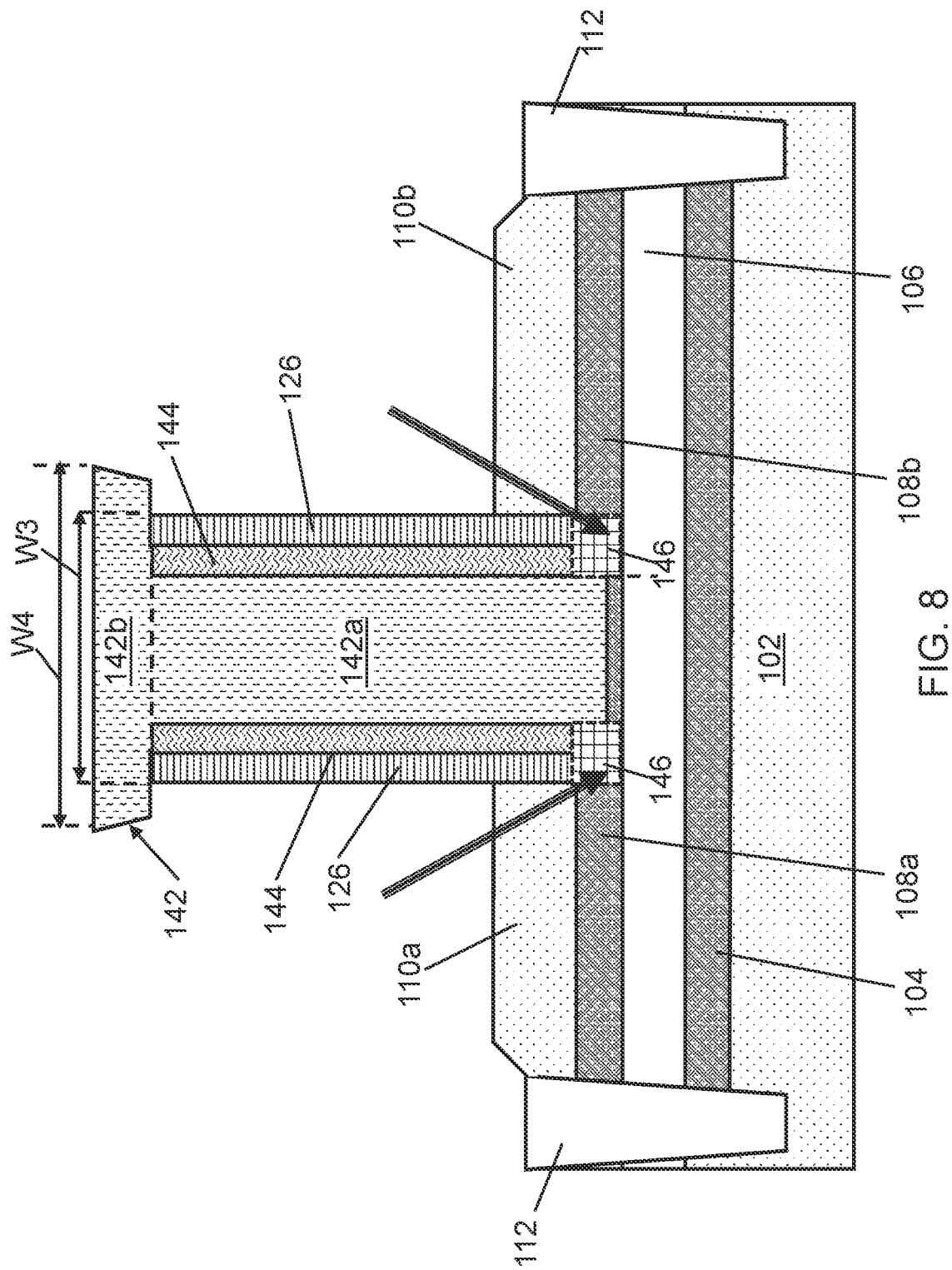
FIG. 8 shows a cross-sectional view of doping E/C materials below a base material with an expanded upper base region according to embodiments of the disclosure.

FIGS. 7 and 8 depict processes to introduce dopants into portions of E/C layer 108 to form one or more E/C junctions 146 adjacent base layer 142. E/C junction(s) 146 may be formed, e.g., by diagonally oriented implantation of ions (indicated by arrows) into E/C layer(s) 108a, 108b. E/C junctions 146 thus may have a same doping type but higher doping concentration than adjacent E/C layer(s) 108a, 108b, e.g., to control the conductivity of E/C layer(s) 108a, 108b adjacent below base layer 142. Diagonally oriented implantation may be advantageous, e.g., because dopant ions will pass through spacers 126, 144 without diffusing into their structure, thereby affecting only E/C layer(s) 108a, 108b. In some cases, only one E/C junction 146 may be formed, such that only one side of base layer 142 is adjacent an E/C junction 146. The doping of E/C layer(s) 108a, 108b may be implemented without regard to the shape or size of upper base region 142b. That is, E/C layer(s) 108a, 108b may be doped to form E/C junctions 146 therein regardless of whether upper base region 142b overhangs spacer(s) 126, 144 or does not extend beyond the width of spacer(s) 126, 144.

FIGS. 7 and 8 also depict possible variations in the size of upper base region 142b as compared to lower base region 142a. For instance, FIG. 7 depicts lower base region 142a as having a horizontal width W1 that is smaller than a horizontal width W2 of upper base region 142b thereover. In this case however, horizontal width W2 does not extend beyond the perimeter of outer spacer(s) 126 and optionally may be within the outer perimeter of inner spacer(s) 144. In another example, FIG. 8 depicts lower base region 142a, inner spacer 144, and outer spacer 126 as having a combined horizontal width W3 that is less than a horizontal width W4 of upper base region 142b thereover. In this case, upper base region 142b "overhangs" spacers 126, 144 to produce a significantly greater surface area where contacts may be formed thereon. The horizontal width of upper base region 142b may depend on the size of barrier liner 130 (FIGS. 1-4, compare liners 130a (FIG. 2) and 130b (FIG. 3)) as discussed herein. Thus, barrier liner 130 can be used to define the eventual thickness of upper base region 142b.

Figure 9:
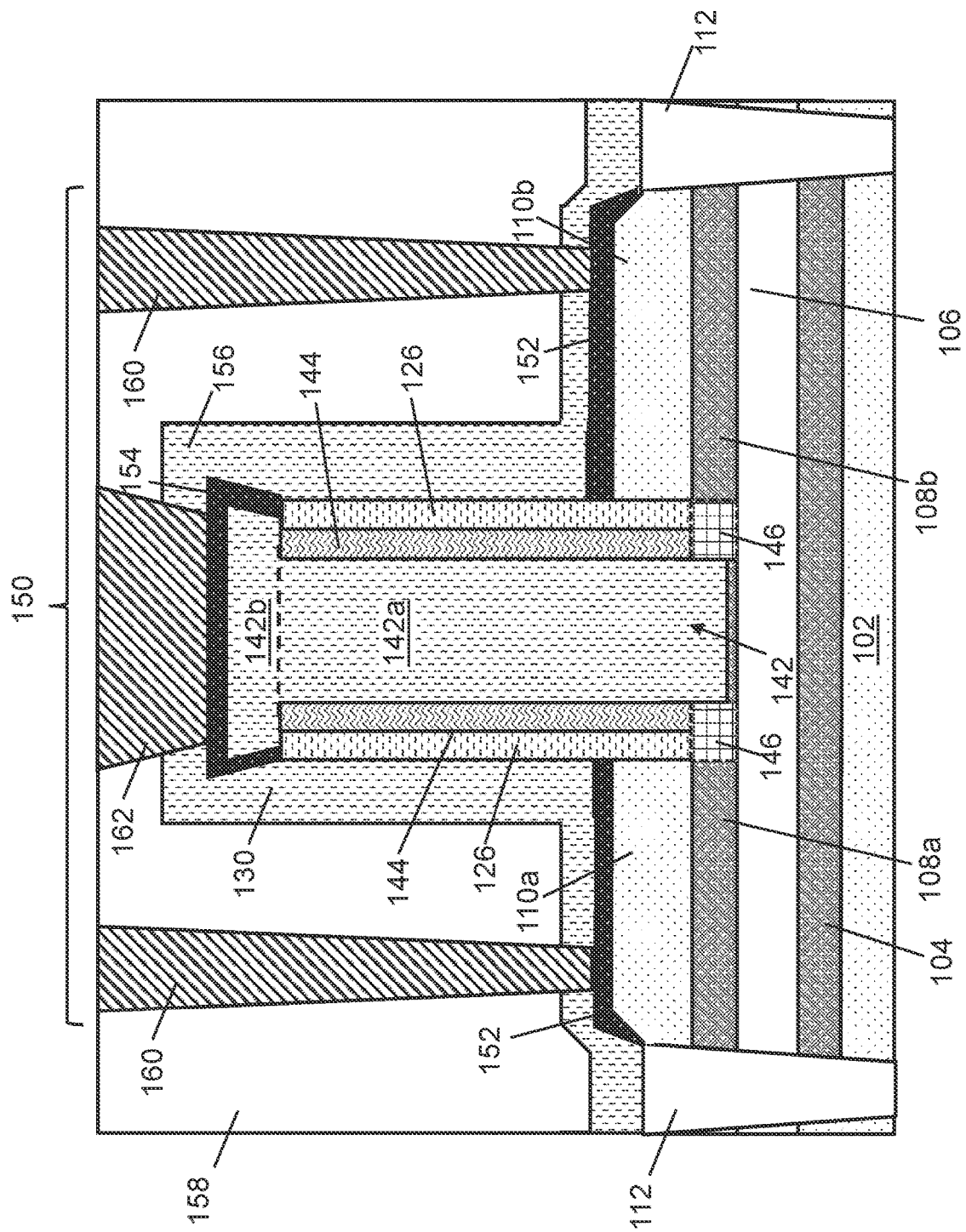
FIG. 9 shows a cross-sectional view of a bipolar transistor structure having a base of varying width according to embodiments of the disclosure.

FIG. 9 depicts further processing to yield a bipolar transistor structure 150 according to embodiments of the disclosure. Such processing may include forming conductive contacts to overlying E/C layers 110a, 110b and upper base region 142b. In some implementations, a set of E/C silicide layers 152 may be formed on overlying E/C layers 110a, 110b and a base silicide layer 154 may be formed on upper base region 142b. For example, a conductive metal such as cobalt (Co), titanium (Ti), nickel (Ni), platinum (Pt), or similar material may be formed on layers overlying E/C layers 110a, 110b and upper base region 142b. The conductive material may be annealed while in contact with the underlying semiconductor material to produce silicide layers 152, 154 for electrically coupling semiconductor materials to contacts formed thereon. Excess conductive material can then be removed using any now known or later developed solution, e.g., etching.

Further processing may include forming an insulative coating 156 on exposed portions of TI(S) 112, silicide layers 152, 154, and/or outer spacers 126. Insulative coating 156 may be formed by conformal deposition of nitride and/or other insulators to electrically isolate the various electrically active components of bipolar transistor structure 150 from adjacent or overlying components. Insulative coating 156 may have a same or similar composition to that of barrier liner 130 discussed herein and may be formed by repeating the same technique(s) used to form barrier liner 130. In some cases, coating 156 may be omitted.

FIG. 9 depicts the forming of an inter-level dielectric (ILD) layer 158 above insulative coating 156 and bipolar transistor structure 150 by deposition or other techniques of forming an insulative material on a structure. ILD layer 158, in this position, also may surround the outer periphery of bipolar transistor structure 150. ILD layer 158 may include the same insulating material as insulator layer 106 or may include a different electrically insulative material for vertically separating bipolar transistor structure 150 from overlying materials, e.g., various horizontally extending wires or vias. ILD layer 158 and insulator layer 106 nonetheless constitute different components, e.g., due to insulator layer 106 initially being below E/C layer(s) 108a, 108b. In addition, insulator layer 106 may extend laterally continuously below each of E/C layers 108a, 108b, and base layer 142 and/or laterally from one STI 112 to another STI 112. Insulative coating 156 and ILD layer 158 at this stage may indicate only a portion of the eventual insulative material to be formed over bipolar transistor structure 150. After depositing ILD layer 158, it can be planarized (e.g., using CMP), but its upper surface may remain above E/C layer(s) 108a, 108b, 110a, 110b and base layer 142 such that it covers these materials.

To electrically couple various elements of bipolar transistor structure 150 discussed herein to metallization layers, a set of E/C contacts 160 may be formed on E/C materials 110a, 110b and within ILD layer 158. Similarly, a base contact 162 contacting upper base region 142b, and located within ILD layer 158, may be formed. Due to the significantly larger horizontal width of upper base region 142b as compared to lower base region 142a, base contact 162 may feature a larger horizontal width than lower base region 142a. One or more of contacts 160, 162 to overlying circuit elements may be formed within predetermined portions of ILD layer 158 by a controlled amount of vertical etching to form openings to one or more contact sites, and then filling the openings with a conductor. Each contact 160, 162 may include any currently known or later developed conductive material configured for use in an electrical contact, e.g., tungsten (W), copper (Cu), aluminum (Al), etc. Contacts 160, 162 may additionally include refractory metal liners (not shown) positioned alongside ILD layer 158 to prevent electromigration degradation, shorting to other components, etc. After contacts 160, 162 are formed to form electrical couplings to E/C layers 108a, 108b, 110a, 110b and base layer 142 through ILD layer 158 from overlying conductive layers (not shown), the structure defines bipolar transistor structure 150.

Figure 10:
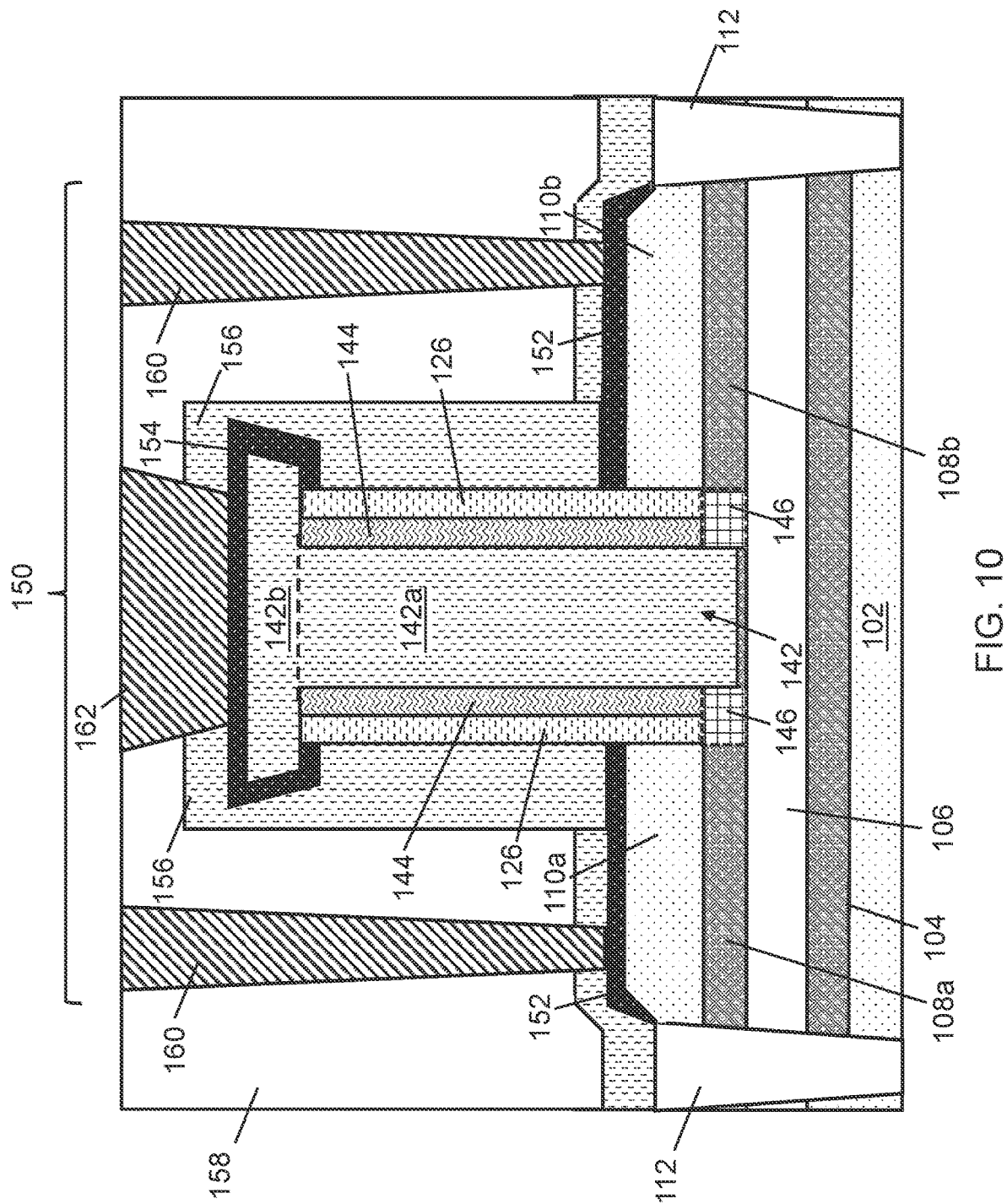
FIG. 10 shows a cross-sectional view of a bipolar transistor structure having a base of varying width according to further embodiments of the disclosure.

FIGS. 9 and 10 depict example implementations of bipolar transistor structure 150. FIG. 9 depicts upper base region 142b as having a smaller horizontal width than a combined horizontal width of lower base region 142a and spacers 126, 144. FIG. 10 depicts upper base region 142b as having a larger horizontal width than a combined horizontal width of lower base region 142a and spacers 126, 144, i.e., it overhangs outer spacer 126 and extends horizontally into insulative coating 156 (or, alternatively, ILD layer 158).

Bipolar transistor structure 150 thus may include E/C layer(s) 108a, 108b on insulator layer 106, and spacer(s) 126, 144 may be on E/C layer(s) 108a, 108b. In bipolar transistor structure 150, first E/C layer 108a may define an emitter while second E/C layer 108b defines a collector or vice versa. Base layer 142 may include lower base region 142a over a second portion of insulator layer 106, such that lower base region 142a is adjacent E/C layer(s) 108a, 108b and spacer(s) 126, 144 thereover. Upper base region 142b may be on lower base region 142a and spacer(s) 126, 144, such that upper base region 142b is wider than the width of lower base region 142a (as shown in FIG. 9), or the combined width of lower base region 142a and spacers 126, 144. In this configuration, base layer 142b may be substantially T-shaped due to the relative widths of lower base region 142a and upper base region 142b. To further control current flow between emitter and collector terminals of bipolar transistor structure 150, overlying E/C layers 110a, 110b may be adjacent outer spacer 126 and positioned on E/C layer(s) 108a, 108b. Overlying E/C layers 110a, 110b may have a different doping concentration than E/C layer(s) 108a, 108b, e.g., they may have the same doping type but a higher concentration to better interface with overlying E/C contacts 160 through E/C suicide layers 152.

Embodiments of the disclosure may provide several technical advantages, examples of which are discussed herein. For example, embodiments of the disclosure provide base layer 142 for bipolar transistor structure 150 that has a different horizontal width or shape than the base region of conventional bipolar transistors. The expanded width of base layer 142 in upper base region 142b thereof may allow base contacts 162 be formed more easily, with significantly greater width(s), and with less risk of electrical shorting from upper base region 142 to E/C layers 108a, 108b, 110a, 110b. The expanded width of upper base region 142b also provides more mechanical support for base contacts 162 thereon. E/C junctions 146 also may be included, despite the presence of a wider upper base region 142b to reduce resistance between overlying E/C layers 110a, 110b through E/C layer(s) 108a, 108b. These advantages may improve various aspects of electrical performance, e.g., stronger control over threshold frequency and/or maximum frequencies, and may be implemented without significant changes to conventional processing and/or by including at most one additional masking layer.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bipolar transistor structure comprising:
   a first emitter/collector (E/C) layer on an insulator layer;
   a base layer over the insulator layer;
   a spacer between the first E/C layer and the base layer, wherein the base layer includes:
      a lower base region, wherein the spacer is adjacent to the lower base region and the first E/C layer, and
      an upper base region on the lower base region and the spacer, wherein a horizontal width of the upper base region is larger than a horizontal width of the lower base region; and
   a silicide layer on the upper base region, wherein the silicide layer contacts an upper surface, a lower surface, and sidewalls of the upper base region.

2. The bipolar transistor structure of claim 1, wherein the horizontal width of the upper base region is larger than a combined horizontal width of the lower base region and the spacer.

3. The bipolar transistor structure of claim 1, wherein the spacer includes:
   an inner spacer adjacent the lower base region of the base layer; and
   an outer spacer adjacent the inner spacer, wherein the upper base region is on the inner spacer and the outer spacer.

4. The bipolar transistor structure of claim 1, wherein the base layer is substantially T-shaped.

5. The bipolar transistor structure of claim 1, further comprising an overlying E/C layer on the first E/C layer, wherein a dopant concentration of the overlying E/C layer is different from a dopant concentration of the first E/C layer.

6. The bipolar transistor structure of claim 1, further comprising:
   a second E/C layer on the insulator layer; and
   an additional spacer adjacent the second E/C layer and the base, wherein the base is laterally between the first E/C layer and the second E/C layer,
   wherein the insulator layer extends laterally continuously below the first E/C layer, the base, and the second E/C layer.

7. The bipolar transistor structure of claim 1, further comprising a base contact on the upper base region of the base layer, wherein a horizontal width of the base contact is greater than a horizontal width of the lower base region.

8. A bipolar transistor structure comprising:
   a first emitter/collector (E/C) layer on a first portion of an insulator layer;
   a spacer on the first E/C layer;
   a base layer over a second portion of the insulator layer, the base layer including:
      a lower base region on the insulator layer, wherein the first E/C layer and the spacer are adjacent the lower base region, and
      an upper base region on the lower base region and the spacer, wherein a horizontal width of the upper base region is larger than a combined horizontal width of the lower base region and the spacer, and the upper base region overhangs an outers sidewall of the spacer; and
   a silicide layer on the upper base region, wherein the silicide layer contacts an upper surface, a lower surface, and sidewalls of the upper base region.

9. The bipolar transistor structure of claim 8, wherein the spacer includes:
   an inner spacer adjacent the lower base region of the base layer; and
   an outer spacer adjacent the inner spacer, wherein the upper base region is on the inner spacer and the outer spacer.

10. The bipolar transistor structure of claim 8, further comprising an overlying E/C layer on the first E/C layer, wherein a dopant concentration of the overlying E/C layer is different from a dopant concentration of the first E/C layer.

11. The bipolar transistor structure of claim 8, further comprising:
   a second E/C layer on the insulator layer; and
   an additional spacer adjacent the second E/C layer and the base, wherein the base is laterally between the first E/C layer and the second E/C layer, wherein the insulator layer extends laterally continuously below the first E/C layer, the base, and the second E/C layer.

12. The bipolar transistor structure of claim 8, further comprising a base contact on the upper base region of the base layer, wherein a horizontal width of the base contact is greater than a horizontal width of the lower base region.

13. The bipolar transistor structure of claim 8, wherein the base layer is substantially T-shaped.

14. A method of forming bipolar transistor structure, the method comprising:
   forming a first emitter/collector (E/C) layer on an insulator layer;
   forming a base layer over the insulator layer;
   forming a spacer between the first E/C layer and the base layer,
   wherein the base layer includes:
      a lower base region, wherein the spacer is adjacent to the lower base region and the first E/C layer, and
      an upper base region on the lower base region and the spacer, wherein a horizontal width of the upper base region is larger than a horizontal width of the lower base region; and
      a silicide layer on the upper base region, wherein the silicide layer contacts an upper surface, a lower surface, and sidewalls of the upper base region.

15. The method of claim 14, wherein the horizontal width of the upper base region is larger than a combined horizontal width of the lower base region and the spacer.

16. The method of claim 14, wherein forming the spacer includes:
   forming an inner spacer adjacent the lower base region of the base layer; and
   forming an outer spacer adjacent the inner spacer, wherein the upper base region is on the inner spacer and the outer spacer.

17. The method of claim 14, wherein the base layer is substantially T-shaped.

18. The method of claim 14, further comprising forming an overlying E/C layer on the first E/C layer, wherein a dopant concentration of the overlying E/C layer is different from a dopant concentration of the first E/C layer.

19. The method of claim 14, further comprising forming a base contact on the upper base region of the base layer, wherein a horizontal width of the base contact is greater than a horizontal width of the lower base region.

20. The method of claim 14, further comprising:
   forming a second E/C layer on the insulator layer; and
   forming an additional spacer adjacent the second E/C layer and the base, wherein the base is laterally between the first E/C layer and the second E/C layer,
   wherein the insulator layer extends laterally continuously below the first E/C layer, the base, and the second E/C layer.

\* \* \* \* \*